United States Patent [19]

Matsui et al.

[11] Patent Number: 5,297,105
[45] Date of Patent: Mar. 22, 1994

[54] SEMICONDUCTOR MEMORY CIRCUIT

[75] Inventors: Katsuaki Matsui; Sampei Miyamoto; Tamihiro Ishimura, all of Tokyo, Japan

[73] Assignee: Oki Electric Industry Co., Ltd., Tokyo, Japan

[21] Appl. No.: 30,708

[22] Filed: Mar. 12, 1993

[30] Foreign Application Priority Data

Mar. 13, 1992 [JP] Japan .................................. 4-055764

[51] Int. Cl.$^5$ .............................................. G11C 8/00
[52] U.S. Cl. .............................. 365/230.06; 365/230.03
[58] Field of Search ............... 365/230.06, 230.03, 365/227

[56] References Cited

U.S. PATENT DOCUMENTS

| 4,660,178 | 4/1987 | Hardee et al. | 365/189 |
| 4,811,297 | 3/1989 | Ogawa | 365/230.03 X |
| 4,849,943 | 7/1989 | Ptennings | 365/230.03 |
| 5,161,121 | 11/1992 | Cho | 365/230.06 X |
| 5,237,536 | 8/1993 | Ohtsuki | 365/230.03 X |

FOREIGN PATENT DOCUMENTS 138796 7/1985 Japan .

Primary Examiner—Eugene R. LaRoche
Assistant Examiner—Do Hyun Yoo
Attorney, Agent, or Firm—Edward D. Manzo

[57] ABSTRACT

A semiconductor memory circuit selects one memory cell group in response to an address signal having block selection information, first and second significant bit information. First to third memory cell blocks respectively have memory cell groups each including memory cells. First to third decoder groups respectively have first decoders each coupled to one memory cell group in the first memory cell block, second decoders each coupled to one memory cell group in the second memory cell block, and third decoders each coupled to one memory cell group in the third memory cell block. First and second logic circuits respectively output a first common block selection signal with respect to the first and second memory cell blocks in response to the block selection information of the address signal, and a second common block selection signal with respect to the second and third memory cell blocks in response to the block selection information of the address signal. Third and fourth logic circuits respectively, in response to the second and the first information, apply first common decode signals to the first and second decoder groups upon the first common block selection signal being outputted, and a plurality of second common decode signals to the second and third decoder groups upon the second common block selection signal being outputted. In response to the first and second common decode signals, a second decoder in the second decoder group is activated so as to select one memory cell group in the second memory cell block.

8 Claims, 3 Drawing Sheets

SEMICONDUCTOR MEMORY CIRCUIT

BACKGROUND OF THE INVENTION

1. Field of the Invention

The present invention relates to a semiconductor memory circuit, and particularly to a semiconductor memory circuit of a type wherein an on-chip decoder circuit and on-board circuits related to the decoder circuit have been improved.

2. Description of the Related Art

A decoder circuit employed in a semiconductor memory circuit has been disclosed in Japanese Laid-Open Patent Publication No. 60-138796, published on Jul. 23, 1985 of which the entire disclosure is incorporated herein by reference.

The disclosed semiconductor memory circuit is one of a type wherein decoder lines have been doubled for the purpose of achieving less power consumption and high-speed operations of decoder circuit. However, the disclosed decoder circuit needs many decoders. The patterns for the decoder circuit therefore require a larger lay out area when the decoder circuits are formed on a semiconductor chip. This is a clear disadvantage.

SUMMARY OF THE INVENTION

It is therefore an object of the present invention to provide a decoder circuit which is comprised of relatively fewer number of decoders and can provide high-speed operations and less power consumption substantially in the same manner as described in the aforementioned Related Art.

A semiconductor memory circuit according to the invention is provided wherein the semiconductor memory circuit to select one of memory cell groups in response to an address signal (having block selection information, first significant bit information and second significant bit information) includes a first memory cell block having a plurality of memory cell groups each including a plurality of memory cells; a second memory cell block having a plurality of memory cell groups each including a plurality of memory cells; a third memory cell block having a plurality of memory cell groups each including a plurality of memory cells; a first decoder group having a plurality of first decoders, the first decoders each being coupled to one of the memory cell groups in the first memory cell block; a second decoder group having a plurality of second decoders, the second decoders each being coupled to one of the memory cell groups in the second memory cell block; a third decoder group having a plurality of third decoders, the third decoders each being coupled to one of the memory cell groups in the third memory cell block; a first logic circuit outputting a first common block selection signal with respect to the first and second memory cell blocks in response to the block selection information of the address signal; a second logic circuit outputting a second common block selection signal with respect to the second and third memory cell blocks in response to the block selection information of the address signal; a fourth logic circuit, in response to the second significant information, applying a plurality of first common decode signals to the first and second decoder groups upon the first common block selection signal being outputted; a fifth logic circuit, in response to the first significant information, applying a plurality of second common decode signals to the second and third decoder groups upon the second common block selection signal being outputted; and one of the second decoders in the second decoder group, in response to the first and second common decode signals, being activated so as to select one of memory, cell groups in the second memory cell block.

DETAILED DESCRIPTION OF THE PREFERRED EMBODIMENTS

Figure 1:
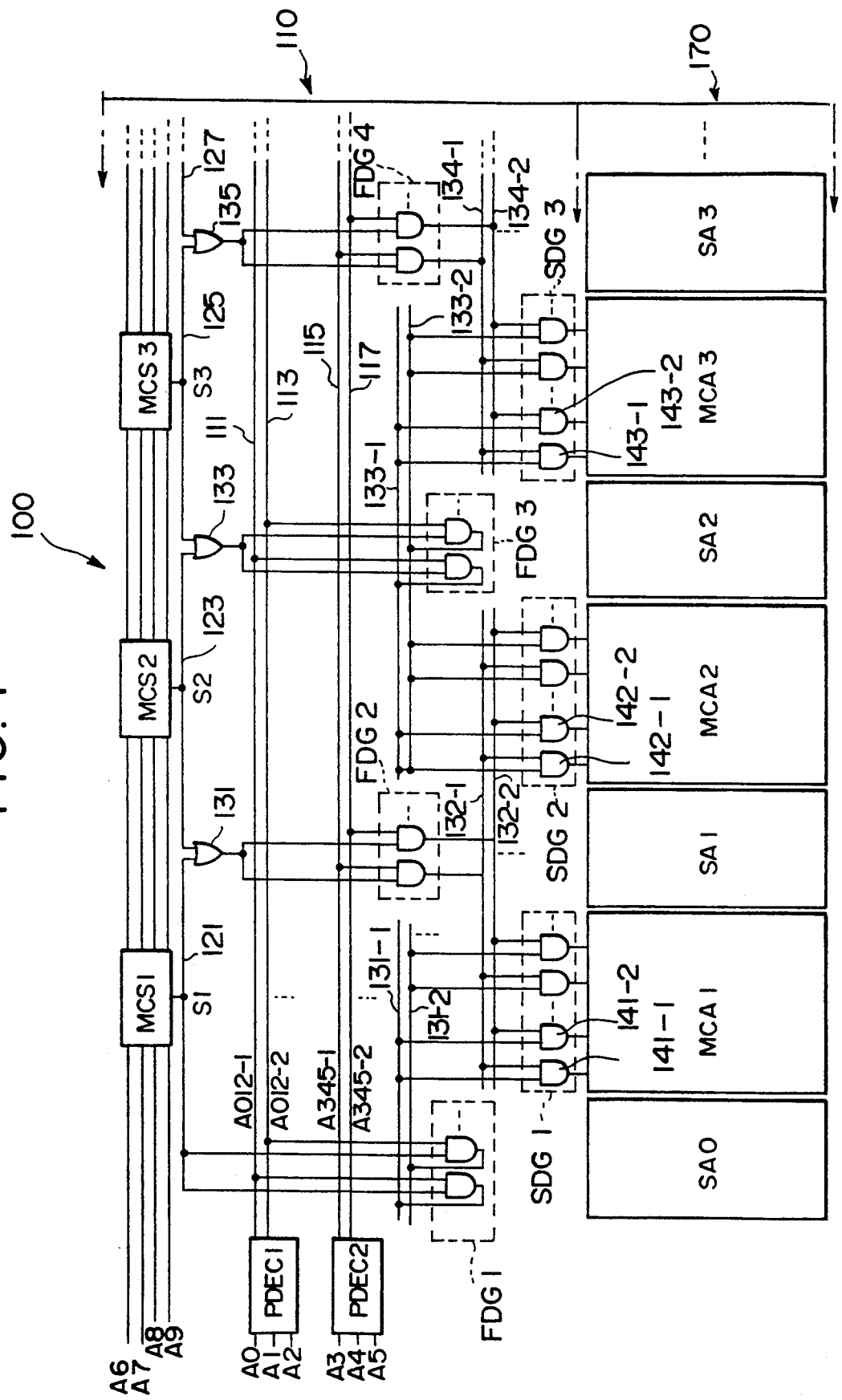
FIG. 1 is a circuit diagram showing a semiconductor memory circuit according to one embodiment of the present invention.

FIG. 1 shows a decoder circuit 110 and a memory array 170 having a plurality of memory cells selected by the decoder circuit 110, together constituting a semiconductor memory circuit 100 according to the present invention. Incidentally, a circuit configuration which has been well-known to the art is omitted from the semiconductor memory circuit 100 shown in FIG. 1.

The memory array 170 comprises a plurality of memory cell array blocks MCA1 to MCA3 and a plurality of sense amplifier circuits SA0 to SA3. The configuration of a conventional memory cell block and the electrical connection between the memory cell block and conventional sense amplifier circuits will be described below with reference to FIG. 2.

Figure 2:
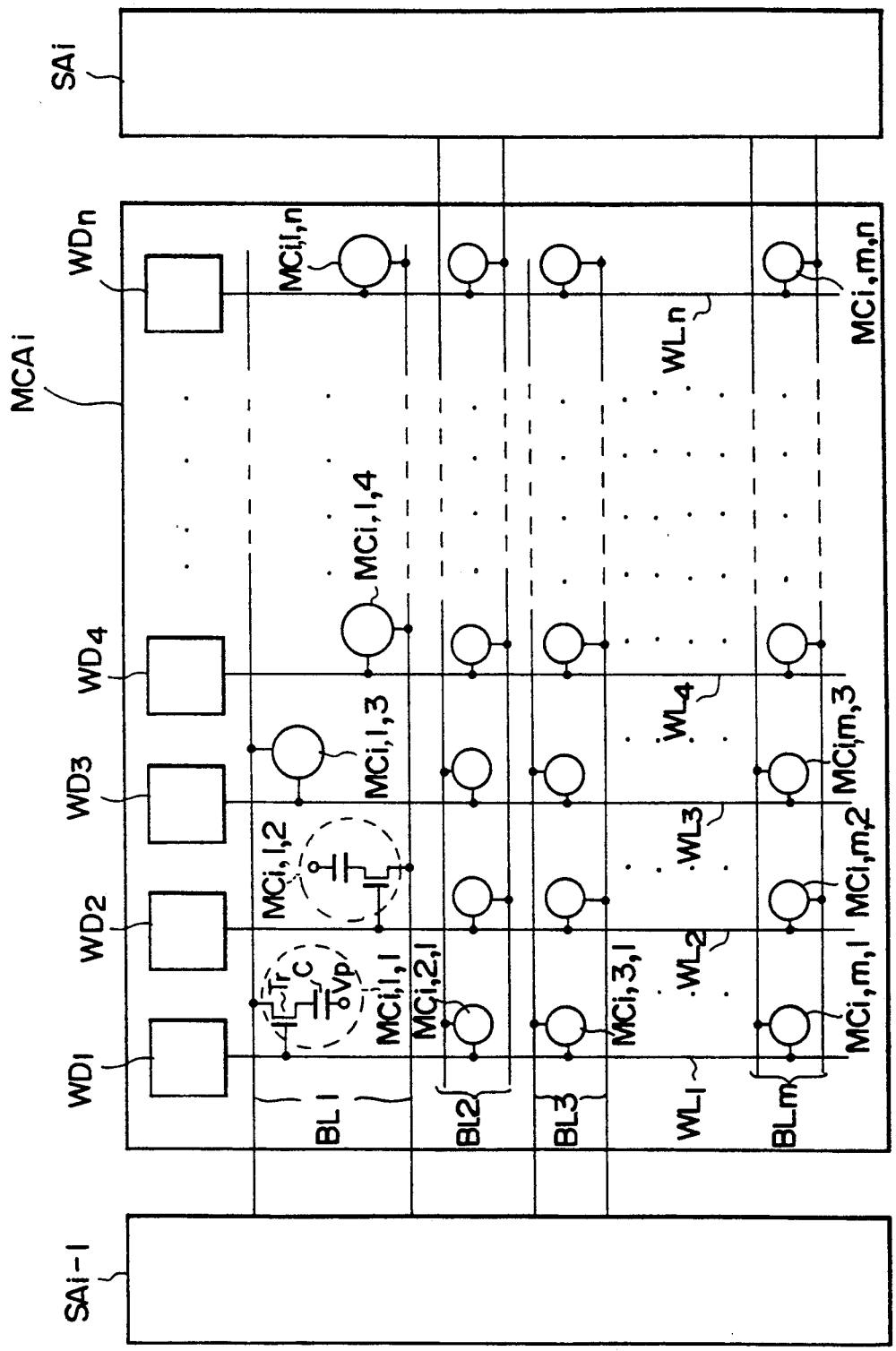
FIG. 2 is a diagram illustrating the structure of a conventional memory cell block and the electrical connection between the memory cell block and sense amplifier circuits in FIG. 1.

A memory cell array block MCAi illustrated in FIG. 2 represents the configuration of an ith memory cell block shown in FIG. 1. The memory cell array block MCAi has n word line drivers WD1 to WDn selectively driven by the decoder circuit 110. The word line drivers WDk(k=1−n) are electrically coupled to M memory cells MCi,1,k to MCi,m,k through word lines WLk respectively. The configuration of each of the memory cells Mci,j,k(j=1−m) will now be described using a memory cell MCi,1,1. The memory cell MCi,1,1 has a capacitor C to store electric charge (information) therein and a (negative channel type) transistor Tr. One electrode of the capacitor C is supplied with a predetermined voltage potential Vp (e.g., a middle voltage potential of an external power source voltage Vcc and a ground voltage), while the other electrode of the capacitor C is coupled to one bit line of bit line pair BL1 through the transistor Tr. The gate electrode of the transistor Tr is electrically connected to a word line WL1. Therefore, when the word line WL1 is activated by the word line driver WD1, that is, the word line WL1 is brought to a boosted high logic level (normally higher than the power source voltage Vcc plus the threshold voltage Vth of the transistor Tr), the transistor Tr is sufficiently brought to an ON condition. As a result, the electric charge stored in the capacitor C can be transferred to the bit line of the bit line pair BL1, which is electrically connected to the capacitor C via the transistor Tr.

When a single word line driver WDk selected by the decoder circuit 110 activates its corresponding word line WLk, respective information of the row of memory cells MCi,1,k to MCi,m,k is supplied to their corresponding responding bit line pairs BL1 to BLm. Thus, the differences in potentials are respectively produced between the respective bit line pairs.

A sense amplifier SAi-1 shown in FIG. 2 is electrically connected to odd-numbered bit line pairs BL1, BL3, . . . , BLm-1 of the memory cell array block MCAi and is of a circuit for amplifying the differences in potentials between the respective odd-numbered bit line pairs BL1 to BLm-1. Further, the sense amplifier SAi-1 is also used as a circuit for amplifying the differences in potentials produced between respective odd-numbered bit line pairs of an unillustrated memory cell block MCAi-1. On the other hand, a sense amplifier SAi shown in FIG. 2 is electrically connected to even-numbered bit line pairs BL2, BL4, . . . , BLm of the memory cell array block MCAi and amplifies the differences in potentials produced between the respective even-numbered bit line pairs BL2 to BLm. Further, the sense amplifier SAi is also used as a circuit for amplifying the differences in potentials produced between respective even-numbered bit line pairs of an unillustrated memory cell array block MCAi+1. Thus, the sense amplifiers are shared. Incidentally, the differences in the potentials, which have been amplified by the sense amplifiers SAi-1 and SAi are outputted from an unillustrated known output circuit as data.

The decoder circuit 110 shown in FIG. 1 activates the word line driver WD of the memory array 170 in response to row address signals comprised of binary signals (i.e., a high logic level and a low logic level) represented in the form of 10 bits in total, which comprise A0 to A2, A3 to A5 and A6 to A9. The decoder circuit 110 includes a conventional predecoder circuit PDEC1 for receiving less significant 3 bits A0 to A2 of the row address signals therein and outputting eight less significant predecode signals A012-1 to A012-8 therefrom. Circuit 110 also includes a conventional predecoder circuit PDEC2 for receiving intermediate significant 3 bits A3 to A5 of the row address signals therein and outputting eight intermediate significant predecode signals A345-1 to A345-8 therefrom. It further includes conventional memory cell array block selectors MCS1 to MCS3 which receive the four more significant bits A6 to A9 of the row address signals therein respectively and one of which is selected based on the more significant 4 bits A6 to A9. Incidentally, FIG. 1 shows the case where any one of the three memory cell array block selectors MCS1 to MCS3 is selected in accordance with the A6 to A9. However, any one of 16 memory cell array block selectors can also be selected based on the A6 to A9.

Let's now assume that the memory cell array block selector MCS2 has been selected in accordance with the more significant 4 bits A6 to A9 of the row address signals. In this case, the selected memory cell array block selector MCS2 outputs a block selection signal S2 of a high logic level, whereas the non-selected memory cell array block selectors MCS1 and MCS3 output block selection signals S1 and S3 of low logic levels respectively.

Figure 3:
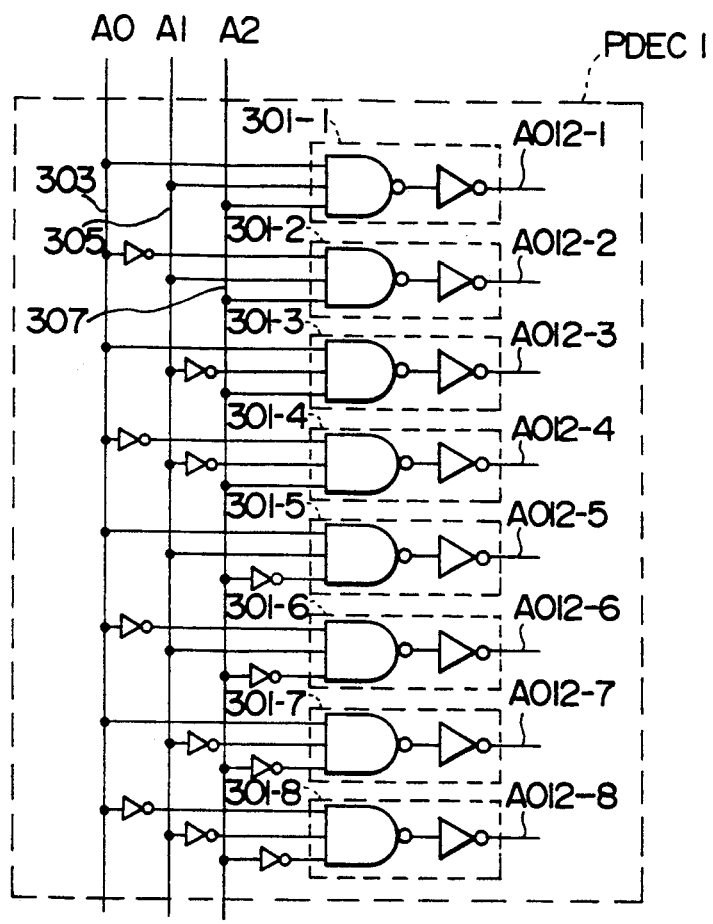
FIG. 3 is a circuit diagram of a predecoder circuit in FIG. 1.

The configuration of the predecoder circuit PDEC1 discussed above will be described below with reference to FIG. 3. The predecoder circuit PDEC1 has a plurality of predecoders 301-1 to 301-8 each of which comprises a NAND logic circuit having three input terminals and an inverter for inverting the output of the NAND logic circuit. As shown in FIG. 3, the three input terminals of the respective NAND logic circuits of the predecoders 301-1 to 301-8 are electrically connected directly or via inverters to their corresponding ones of signal lines 303, 305 and 307 for transferring the less significant 3 bits A0 to A2 of the row address signals respectively. The NAND logic circuits output signals of low logic levels respectively only when the three input terminals of the NAND logic circuits each receive input signals of high logic levels. When, on the other hand, the three input terminals do not each receive input signals of the high logic levels, the NAND logic circuits output signals of high logic levels respectively. That is, when all the less significant 3 bits (A0, A1 and A2) of the row address signals are of high logic levels (hereinafter called "(1,1,1)"), the output of only the NAND logic circuit of the predecoder 301-1 is brought to a low logic level, and the output of each of the NAND logic circuits of the other predecoders 301-2 to 301-8 is brought to a high logic level. Further, the outputs of the respective NAND logic circuits are inverted by their corresponding inverters so as to produce less significant predecode signals A012-1 to A012-8. Thus, when the less significant 3 bits of the aforementioned row address signals are of (1,1,1), only the less significant predecode signal A012-1 output from the predecoder 301-1 is brought to a high logic (activation) level, and the less significant predecode signals A012-2 to A012-8 output from the remaining predecoders 301-2 to 301-8 respectively are all brought to low logic levels. Similarly, when the less significant 3 bits are of (0,1,1), (1,0,1), (0,0,1), (1,1,0), (0,1,0), (1,0,0) and (0,0,0) respectively, only the less significant predecode signals A012-2, A012-3, A012-4, A012-5, A012-6, A012-7 and A012-8 are brought to high logic levels respectively.

Thus, the predecoder circuit PDEC1 shown in FIG. 3 can bring any one of the less significant predecode signals A012-1 to A012-8 to a high logic (activation) level and each of the remaining less significant predecode signals to a low logic (non-activation) level in response to the less significant 3 bits A0 to A2 of the row address signals.

On the other hand, the predecoder circuit PDEC2 is substantially identical in circuit configuration to the aforementioned predecoder circuit PDEC1 except that the intermediate significant 3 bits A3 to A5 are input as an alternative to the less significant 3 bits A0 to A2 of the row address signals. In response to the intermediate significant 3 bits A3 to A5 of the row address signals, the predecoder circuit PDEC2 can bring any one of the intermediate significant predecode signals A345-1 to A345-8 to the high logic (activation) level and each of the remaining intermediate significant predecode signals to the low logic (nonactivation) level.

Figure 4:
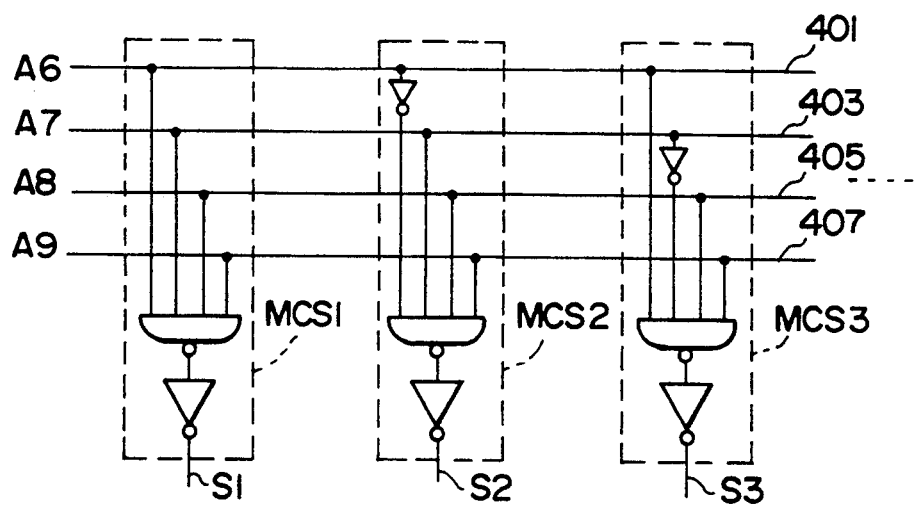
FIG. 4 is a diagram showing the structure of each of memory cell array block selectors in FIG. 1.

The configuration of each of the memory cell array block selectors MCS1 to MCS3 will next be described below with reference to FIG. 4. Each of the memory cell array block selectors MCS1 to MCS3 comprises a NAND logic circuit having four input terminals and an inverter for inverting the output of the NAND logic circuit. As shown in FIG. 4, the four input terminals of the respective NAND logic circuits of the memory cell array block selectors MCS1 to MCS3 are electrically connected directly or via inverters to their corresponding ones of signal lines 401, 403, 405 and 407 for transferring the more significant 4 bits A6 to A9 of the row address signals respectively. The NAND logic circuits output signals of low logic levels respectively only when the four input terminals of the respective NAND logic circuits receive input signals of high logic levels respectively. When, on the other hand, the four input terminals do not receive the input signals of the high logic levels respectively, the NAND logic circuits output signals of high logic levels respectively. That is, when all the more significant 4 bits (A6, A7, A8 and A9) of the row address signals are of high logic levels (hereinafter called "(1,1,1,1)"), the output of only the NAND logic circuit of the memory cell array block selector MCS1 is brought to a low logic level, and the output of each of the NAND logic circuits of the other memory cell array block selectors MCS2 and MCS3 is brought to a high logic level. Further, the outputs of the respective NAND logic circuits are inverted by their corresponding inverters so as to produce block selection signals S1 to S3. Thus, when the more significant 4 bits of the aforementioned row address signals are of (1,1,1,1), only the block selection signal S1 output from the memory cell array block selector MCS1 is brought to a high logic (activation) level, and the other block selection signals S2 and S3 output from the memory cell array block selectors MCS2 and MCS3 respectively are all brought to low logic levels. Similarly, when the more significant 4 bits are (0,1,1,1) only the block selection signal S2 is brought to a high logic level. When, on the other hand, the more significant 4 bits are (1,0,1,1), only the block selection signal S3 is brought to a high logic level.

Accordingly, 16 memory cell array block selectors including the memory cell array block selectors MCS1 to MCS3 shown in FIG. 4 can bring any one of 16 block selection signals to a high logic (activation) level in response to the more significant 4 bits A6 to A9 of the row address signals and make it possible to bring each of the remaining block selection signals to a low logic (non-activation) level. As a result, any one of the maximum 16 memory cell array blocks can be selected.

The configuration of the decoder circuit 110 according to the present invention, which includes the aforementioned conventional predecoder circuits PDEC1 and PDEC2 and memory cell array block selectors MCS1 and MCS2, will be described below with reference to FIG. 1.

The predecoder circuit PDEC1 of the decoder circuit 110 is electrically connected to eight signal lines for transferring the eight less significant predecode signals A012-1 to A012-8 output from the predecoder circuit PDEC1 (the signal lines other than the two signal lines 111 and 113 for transferring the less significant predecode signals A012-1 and A012-2 respectively are omitted from FIG. 1). Also, the predecoder circuit PDEC2 is electrically connected to eight signal lines for transferring the eight intermediate significant predecode signals A345-1 to A345-8 output therefrom (the signal lines other than the two signal lines 115 and 117 for transferring the intermediate significant predecode signals A345-1 and A345-2 respectively are omitted from FIG. 1).

Further, the memory cell array block selectors MCS1, MCS2 and MCS3 each used to select any one of the memory cell array blocks MCA1 to MCA3 are electrically connected to their corresponding signal lines 121, 123 and 125 and respectively output the (unique) block selection signals S1, S2 and S3 therefrom. Since the signal lines 121 and 123 are electrically connected to their corresponding input terminals of an OR logic circuit 131, the OR logic circuit 131 outputs a common block selection signal of a high logic level therefrom when either one of the block selection signals S1 and S2 is of a high logic (activation) level. Further, since the signal lines 123 and 125 are electrically connected to their corresponding input terminals of an OR logic circuit 133, the OR logic circuit 133 outputs a common block selection signal of a high logic level therefrom when either one of the block selection signals S2 and S3 is brought to the high logic (activation) level. Furthermore, since the signal line 125 and a signal line 127 electrically connected to the output of an unillustrated selector are electrically connected to their corresponding input terminals of an OR logic circuit 135, the OR logic circuit 135 outputs a common block selection signal of a high logic level when either one of the block selection signal S3 and a block selection signal output from the unillustrated selector is brought to the high logic (activation) level.

A first stage decoder group FDG1 has eight decoders (only the two decoders are shown in FIG. 1) each is an AND logic circuit one input of which receives the unique block selection signal S1 output from the memory cell array block selector MCS1 via the signal line 121. The other input of each AND gate of FDG1 receives a corresponding one of the less significant predecode signals A012-1 to A012-8 respectively supplied from the signal lines connected to the predecoder PDEC1. The outputs of the respective decoders are supplied to their corresponding eight common decoder signal lines (only two common decoder signal lines 131-1, 131-2 are shown in FIG. 1).

Another a first stage decoder group FDG2 has eight decoders (only two of which are shown in FIG. 1). Each is an AND logic circuit one input of which receives the common block selection signal output from the OR logic circuit 131, the other input of which receives any corresponding one of the intermediate significant predecode signals A345-1 to A345-8 respectively supplied from the signal lines connected to the predecoder PDEC2. The outputs of the respective decoders are supplied to their corresponding eight common decoder signal lines (only the two common decoder signal lines 132-1 and 132-2 are shown in FIG. 1).

Similarly, a first stage decoder group FDG3 has eight decoders (only two of which are shown in FIG. 1). Each is an AND logic circuit of which one input receives the common block selection signal output from the OR logic circuit 133. The other input receives any corresponding one of the less significant predecode signals A012-1 to A012-8 respectively supplied from the signal lines connected to the predecoder PDEC1. The outputs of the respective decoders are supplied to their corresponding eight common decoder signal lines (only the two common decoder signal lines 133-1 and 133-2 are shown in FIG. 1). A first stage decoder group FDG4 has eight decoders (only two of which are shown in FIG. 1). Each is an AND logic circuit of which one input receives the common block selection signal output from the OR logic circuit 135. The other input receives any corresponding one of the intermediate significant predecode signals A345-1 to A345-8 respectively supplied from the signal lines connected to the predecoder PDEC2. The outputs of the respective decoders are supplied to their corresponding eight common decoder signal lines (only the two common decoder signal lines 134-1 and 134-2 are shown in FIG. 1).

Next, a second stage decoder group SDG1 has 64 decoders (only four of which are shown in FIG. 1).

Each is an AND logic circuit, one input of which receives any one of eight outputs supplied from the first stage decoder group FDG1 via the eight common decoder signal lines, the other input of which receives any one of eight outputs supplied from the first stage decoder group FDG2 via the eight common decoder signal lines. Further, a second stage decoder group SDG2 has 64 decoders (only four of which are shown in FIG. 1). Each is an AND logic circuit having one input that receives any one of eight outputs supplied from the first stage decoder group FDG2 via the eight common decoder signal lines, and having another input that receives any one of eight outputs supplied from the first stage decoder group FDG3 via the eight common decoder signal lines. Another, a second stage decoder group SDG3 has 64 decoders (only four being shown in FIG. 1). Each is an AND logic circuit having one input that receives any one of eight outputs supplied from the first stage decoder group FDG3 via the eight common decoder signal lines, and having another input that receives any one of eight outputs supplied from the first stage decoder group FDG4 via the eight common decoder signal lines. Accordingly, each of the second stage decoder groups SDG1 to SDG3 can selectively drive the 64 word line drivers WD1 to WDn shown in FIG. 2.

The operation of the decoder circuit 110 constructed as described above will be described below. For the purpose of simplifying its description, the operation will now be described using the assumption (illustratively) that the signal line 111 has been brought to the high logic (activation) level in response to the less significant predecode signal A012-1 of the high logic level supplied from the predecoder circuit PDEC1 and the signal line 117 having been brought to the high logic (activation) level in response to the intermediate significant predecode signal A345-2 of the high logic level supplied from the predecoder circuit PDEC2.

When the memory cell array block selector MCS1 outputs the block selection signal S1 of the high logic level, the first stage decoder group FDG1 brings only the common decoder signal line 131-1 to the high logic level, whereas the first stage decoder group FDG2 brings only the common decoder signal line 132-2 to the high logic level. As a result, only the second decoder 141-2 of the second stage decoder group SDG1 outputs a decode signal of a high logic (activation) level. Further, all the other decoders which belong to the second stage decoder groups SDG1 to SDG3, output decode signals of low logic (non-activation) levels.

Next, when the selector MCS2 outputs the block selection signal S2 of the high logic level, the first stage decoder group FDG2 brings only the common decoder signal line 132-2 to the high logic level, whereas the first stage decoder group FDG3 brings only the common decoder signal line 133-1 to the high logic level. As a result, only the second decoder 142-2 of the second stage decoder group SDG2 outputs a decode signal of a high logic (activation) level, and all the other decoders which belong to the second stage decoder groups SDG1 to SDG3, output decode signals of low logic (non-activation) levels.

Further, when the memory cell array block selector MCS3 outputs the block selection signal S3 of the high logic level, the first stage decoder group FDG3 brings only the common decoder signal line 133-1 to the high logic level, whereas the first stage decoder group FDG4 brings only the common decoder signal line 134-2 to the high logic level. As a result, only the second decoder 143-2 of the second stage decoder group SDG3 outputs a decode signal of a high logic (activation) level, whereas all the other decoders which belong to the second stage decoder groups SDG1 to SDG3, output decode signals of low logic (non-activation) levels.

The decoder circuit 110 employed in the semiconductor memory circuit according to the present invention can selectively drive decoders of unillustrated other second stage decoder groups in the same manner as described above.

While the invention has been particularly shown and described with reference to the preferred embodiment thereof, it will be understood by those skilled in the art that various changes in form and details may be made therein without departing from the spirit and scope of the invention.

For example, the common block selection signals respectively output from the OR logic circuits 131, 133 and 135 shown in FIG. 1 may be used to activate their corresponding sense amplifier circuits SA0 to SA3.

What is claimed is:

1. A semiconductor memory circuit for selecting one of memory cell groups in response to an address signal having block selection information, first significant bit information and second significant bit information; comprising:

a first memory cell block having a plurality of cells;
a second memory cell block having a plurality of memory cell groups each including a plurality of memory cells;
a third memory cell block having a plurality of memory cell groups each including a plurality of memory cells;
decoder group having a plurality of first
a first decoders, said first decoders each being coupled to one of the memory cell groups in said first memory cell block;
a second decoder group having a plurality of second decoders, said second decoders each being coupled to one of the memory cell groups in said second memory cell block;
a third decoder group having a plurality of third decoders, said third decoders each being coupled to one of the memory cell groups in said third memory cell block;
a first logic circuit outputting a first common block selection signal with respect to said first and second memory cell blocks in response to the block selection information of the address signal;
a second logic circuit outputting a second common block selection signal with respect to said second and third memory cell blocks in response to the block selection information of the address signal;
a third logic circuit, in response to the second significant bit information, applying a plurality of first common decode signals to said first and second decoder groups upon the first common block selection signal being outputted;
a fourth logic circuit, in response to the first significant bit information, applying a plurality of second common decode signals to said second and third decoder groups upon the second common block selection signal being outputted; and
one of said second decoders in said second decoder group, in response to said first and second common decode signals, being activated so as to select one of the memory cell groups in said second memory cell block.

2. The semiconductor memory circuit according to claim 1, wherein said selected memory cell group in said second memory cell block is coupled to a first word line driver through a first word line, and said activated second decoder activates said first word line driver to apply a first word line drive signal to said first word line.

3. The semiconductor memory circuit according to claim 1, further comprising:
 a first block selector, in response to the block selection information, to output a first unique block selection signal; and
 a fifth logic circuit, in response to the first significant bit information, applying a plurality of third common decode signals to said first decoder group upon the first unique block selection signal being outputted;
wherein one of said first decoders in said first decoder group, in response to said first and third common decode signals, being activated so as to select one of the memory cell groups in said first memory cell block.

4. The semiconductor memory circuit according to claim 3, wherein said selected memory cell group in said first memory cell block is coupled to a first word line driver through a first word line, and said activated first decoder activates said first word line driver to apply a first word line drive signal to said first word line.

5. The semiconductor memory circuit according to claim 3, further comprising a second block selector, in response to the block selection information, to output a second unique block selection signal, wherein said first logic circuit outputs the first common block selection signal in response to the first and second unique block selection signals.

6. The semiconductor memory circuit according to claim 5, further comprising a third block selector, in response to the block selection information, to output a third unique block selection signal, wherein said second logic circuit outputs the second common block selection signal in response to the second and third unique block selection signals.

7. The semiconductor memory circuit according to claim 1, further comprising:
 a sixth logic circuit outputting a third common block selection signal with respect to said third memory cell block and a fourth memory cell block in response to the block selection information of the address signal; and
 a seventh logic circuit, in response to the second significant bit information, applying a plurality of fourth common decode signals to said third decoder group upon the third common block selection signal being outputted;
wherein one of said third decoders in said third decoder group, in response to said second and fourth common decode signals, being activated so as to select one of the memory cell groups in said third memory cell block.

8. The semiconductor memory circuit according to claim 7, wherein said selected memory cell group in said third memory cell block is coupled to a first word line driver through a first word line, and said activated third decoder activates said first word line driver to apply a first word line drive signal to said first word line.

* * * * *